(12) United States Patent
Schmogrow et al.

(10) Patent No.: US 12,387,108 B2
(45) Date of Patent: Aug. 12, 2025

(54) ENHANCED UNCERTAINTY MANAGEMENT FOR OPTICAL COMMUNICATION SYSTEMS

(71) Applicant: Google LLC, Mountain View, CA (US)

(72) Inventors: Rene Marcel Schmogrow, San Jose, CA (US); Mattia Cantono, San Jose, CA (US)

(73) Assignee: Google LLC, Mountain View, CA (US)

( * ) Notice: Subject to any disclaimer, the term of this patent is extended or adjusted under 35 U.S.C. 154(b) by 1107 days.

(21) Appl. No.: 17/236,678

(22) Filed: Apr. 21, 2021

(65) Prior Publication Data

US 2022/0343176 A1 Oct. 27, 2022

(51) Int. Cl.
*G06N 3/10* (2006.01)
*G06F 30/18* (2020.01)
*G06N 20/00* (2019.01)
*H04B 10/079* (2013.01)

(52) U.S. Cl.
CPC .............. *G06N 3/10* (2013.01); *G06F 30/18* (2020.01); *G06N 20/00* (2019.01); *H04B 10/07953* (2013.01)

(58) Field of Classification Search
CPC .... H04B 10/07953; G06N 3/10; G06N 20/00; G06F 30/18
USPC ......................................................... 398/26
See application file for complete search history.

(56) References Cited

U.S. PATENT DOCUMENTS

| | | | |
|---|---|---|---|
| 9,509,434 B2 | 11/2016 | Swinkels et al. | |
| 9,838,296 B2 | 12/2017 | Armolavicius et al. | |
| 10,148,384 B2 | 12/2018 | Swinkels et al. | |
| 10,542,336 B2 * | 1/2020 | Paraschis | H04Q 11/0062 |
| 10,715,888 B2 * | 7/2020 | Swinkels | H04L 41/344 |
| 11,640,550 B2 * | 5/2023 | Liu | G06F 18/214 |
| | | | 706/14 |
| 2019/0215073 A1 * | 7/2019 | Schmogrow | H04B 10/2543 |
| 2020/0092026 A1 * | 3/2020 | Birk | H04J 14/02122 |
| 2021/0081592 A1 * | 3/2021 | Dandy | G06F 30/20 |
| 2021/0110299 A1 * | 4/2021 | Bisson-Krol | G06N 20/00 |
| 2021/0176146 A1 * | 6/2021 | Vasseur | H04L 41/145 |
| 2022/0329033 A1 * | 10/2022 | Demars | H01S 3/1001 |

OTHER PUBLICATIONS

Andrea D'Amico; Stefano Straullu; Antonino Nespola; Ihtesham Khan; Elliot London; Emanuele Virgillito; Stefano Piciaccia; Aberto Tanzi; Gabriele Galimberti; and Vittorio Curri; Using Machine Learning in an Open Optical Line System Controller; vol. 12, No. 6; Journal of Optical Communications and Networking; 11 pages.
(Continued)

*Primary Examiner* — Dalzid E Singh
(74) *Attorney, Agent, or Firm* — Lerner David LLP

(57) ABSTRACT

Margin hedging in optical communication systems allows for overhead within the optical system. A machine learning model can be trained using the output of a physics based simulation of the optical system as well as the features of the optical system. A trained machine learning model can adjust the results of a physics based simulation of an optical network to more accurately match the adjusted simulation results to the "true" performance of the optical network. The margins of the optical communication system can be more tailored to the true performance of a designed or planned optical system.

17 Claims, 8 Drawing Sheets

(56) References Cited

OTHER PUBLICATIONS

Zhilong Wang, Min Zhang, Danshi Wang, Chuang Song, Min Liu, Jin Li, Liqi Lou, and Zhuo Liu; Failure Prediction Using Machine Learning and Time Series in Optical Network; Aug. 7, 2017, vol. 25, No. 16, Optics Express, 13 pages.

Christodoulopoulos et al. Toward efficient, reliable, and autonomous optical networks: the Orchestra solution [Invited]. Aug. 15, 2019. Journal of Optical Communications and Networking, IEEE, USA, vol. 11, No. 9. 15 pages.

Seve et al. Learning Process for Reducing Uncertainties on Network Parameters and Design Margins. Feb. 1, 2018. Journal of Optical Communications and Networking, vol. 10, No. 2. 9 pages.

Musumeci et al. An Overview on Application of Machine Learning Techniques in Optical Networks. Mar. 21, 2018. ARXIV.org, Cornell University Library, 201 Olin Library Cornell University, Ithaca, NY 14853. 27 pages.

Khan et al. Lightpath QoT computation in optical networks assisted by transfer learning. Feb. 10, 2021. Journal of Optical Communications and Networking, IEEE, USA, vol. 13, No. 4. 11 pages.

Extended European Search Report for European Patent Application No. 22156400.8 dated Aug. 4, 2022. 14 pages.

\* cited by examiner

Method 300

ENHANCED UNCERTAINTY MANAGEMENT FOR OPTICAL COMMUNICATION SYSTEMS

BACKGROUND

Optical communication systems form the backbone of modern data transport systems. The design, planning, and implementation of optical communication links can comprise hundreds or thousands of kilometers of optical fiber, optical amplifiers, and other optical network equipment. Characteristics of these optical network components may be used to model and predict the capacity and performance characteristics of the optical system. Excess capacity available in the network may be related to a margin metric (e.g., X dB), which in turn can be used for design, planning and implementation.

Optical network equipment manufacturers (NEM) can assign characteristics to network components, equipment and systems, including characteristics such as supported capacity and margins related to that capacity. These characteristics generally relate to performance and may include gain and noise characteristics of optical amplifiers for example. These characteristics are used by network operators or network designers when modeling, designing, or creating optical networks. The reported characteristics for a given item of equipment, device or model may have some margin allocated by the network equipment manufacturer. However, network equipment manufacturers often overestimate margins to ensure that their components, equipment, or systems may integrate into a variety of networks, network designs, or network configurations. The estimated margins are universally applied and not tailored to a specific configuration, use cases, or variations in optical systems, such as for example, variations in fiber type, characteristics, amplifiers type, or transponder types. To account for a relatively wide range of possible configurations, use cases, variations, and other factors estimated margins tend to be even larger. While underestimating the margins can lead to an optical network not functioning, overestimating the margins can increase the "per-capacity" cost of the optical network. Thus, a closer match between the true margins and the estimated margins can help reduce costs associated with implementation of an optical network.

On the other hand, it is not always possible to obtain precise individual optical properties of every optical network component in a device, hardware item or equipment as component properties depend on physics, variations and tolerances in the manufacturing process of a component, intra-component relationships, and unique characteristics of the deployed hardware. Even complicated and sophisticated simulation engines rely on a simplified model of the physics and interactions within an optical network or optical link, leading to an imperfect simulated prediction. Further, each simulation model may contain different biases and assumptions, leading to inaccurate simulations for a particular optical link. It is further not possible to obtain an accurate model which can account for all intra-component relationships which depend on complicated optical physics.

In addition, the accuracy of physics based simulation models or other numerical simulations models used for optical link design is directly correlated to their computational time. Thus, more or highly accurate simulations may be impractical or difficult due to the large computational requirement.

SUMMARY

Aspect of the disclosed technology can include any of the following methods, systems, or non-transient computer readable medium containing instructions.

Aspects of the disclosed technology includes methods, systems, or computer readable medium for training a machine learning module, predicting, adjusting, or calculating link design margins. A plurality of link features associated with an optical link can be obtained, the optical link can be simulated with a first model based on the plurality of link features to produce a first value, one or more performance metrics associated with the optical link can be empirically obtained, a second value can be calculated based on the one or more performance metrics, one or more prediction error values based on the first value and the second value can be determined, and a machine learning model can be trained or updated using the plurality of link features and at least one of the one or more prediction error values or the one or more performance metrics.

Aspects of the disclosed technology includes methods, systems, or computer readable medium for predicting, adjusting, or calculating link design margins. A plurality of link features associated with an optical link can be obtained, the optical link can be simulated with a first model based on the plurality of link features to produce a first value, one or more performance metrics associated with the optical link can be empirically obtained, a second value can be calculated based on the one or more performance metrics, one or more prediction error values based on the first value and the second value can be determined, and a machine learning model can be trained or updated using the plurality of link features and at least one of the one or more prediction error values or the one or more performance metrics. A predicted link capacity margin for a new optical link can be provided based on one or more prediction error values. Variability of each of the one or more prediction error values for each of the plurality of link features or the entire link can be determined. The one or more performance metric can comprise a generalized signal to noise ratio.

Aspects of the disclosed technology includes methods, systems, or computer readable medium for predicting, adjusting, or calculating link design margins. An optical link with a first model can be simulated based on a plurality of link features to produce a first simulated value, a trained machine learning model can be provided a plurality of link features and the first simulated value, and an error range associated with the first simulated value can be output by the trained machine learning model. Multiple values or outputs can be obtained from the trained machine learning module. A margin based on the output of the trained machine learning model can be determined. An error range based on trained variability values can be obtained. A margin for the optical link based on the predicted error range can be determined. An output of the machine learning model can be a relationship between generalized signal to noise ratio and frequency for at least one set of link features. The set of link features can be one of a multiplexer, amplifier, or optical fiber.

Aspects of the disclosed technology include a non-transient computer readable medium containing program instructions, the instructions when executed perform the steps of simulating the optical link with a first model based on a plurality of link features to produce a first simulated value, providing to a trained machine learning model the plurality of link features and the first simulated value, and outputting by the trained machine learning model an error range associated with the first simulated value. Multiple values or outputs can be obtained from the trained machine learning module. A margin based on the output of the trained machine learning model can be determined. An error range based on trained variability values can be obtained. A margin for the optical link based on the predicted error range can be determined. An output of the machine learning model can be a relationship between generalized signal to noise ratio and frequency for at least one set of link features. The set of link features can be one of a multiplexer, amplifier, or optical fiber. The trained machine learning model can be trained on a sets of data, wherein each set of data is associated with an optical network, and each set of data comprising one or more of (i) a simulated value for the optical network, (ii) a set of link features, and (iii) empirical data from the optical network.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Overview

Figure 1:
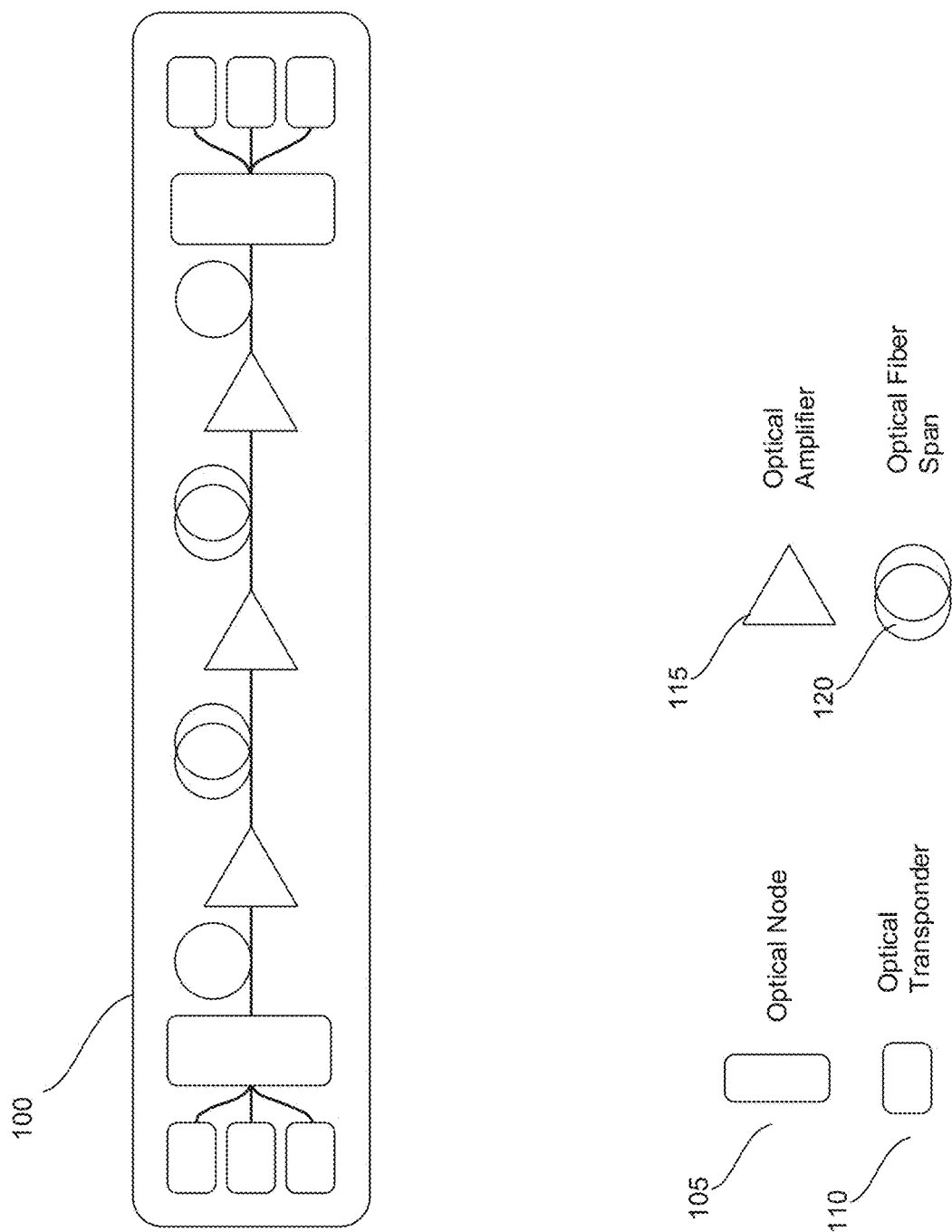
FIG. 1 illustrates a schematic view of an optical communication system or optical communication link according to aspects of the disclosed technology.

Generally, the technology relates to optical communication links, or more generally, optical communication systems. The technology allows for the design of an optical communication link to maximize the capacity of the link and predict the capacity of the optical communication system more accurately. It is generally directed to addressing challenges associated with accurately estimating margins within an optical network to mitigate against the uncertainty between overestimating the system capability and system underutilization due to excessive margins. In some examples, link data or link features, such as fiber type, amplifier type, transponder data, or other features are input to a simulation engine to simulate the overall network. The simulation can output a generalized signal to noise ratio (GSNR) which can be a combination of linear and nonlinear signal-to-noise ratios. The technology can allow for "learn-ing" a correction to predicted GSNR based on empirically observed GSNR with an optical network and link features with that observation to apply a correction to a new optical network. The technology can also allow for "learning" of the variable of a prediction error based on observed link features.

More specifically, the technology relates to using a trained machine learning (ML) model to adjust a simulated performance metric of an optical network to more closely match the actual or true performance of the optical network. The simulated metrics are based on imperfect simulation techniques and use information obtained from network equipment manufacturers. Due to these two factors, the simulated metrics will not precisely describe the true performance metrics of the optical network. As the machine learning model was trained using empirical metrics and a set of optical link features, the machine learning model is able to adjust the simulated metrics based on the features present within an optical network to more closely match the true performance of the optical network.

For instance, the disclosed technology may be used to better estimate or improve the accuracy of existing systems or techniques for optical network capacity estimation For example, the user may provide as input to the system equipment related information, such as for example, fiber type, link length, optical amplifiers, equipment manufacturers, equipment placement along the link, etc., to be used on the optical link. Such information may typically be obtained from manufacturer specifications, fiber vendors and design tools. In addition, the system will also be provided as input actual field performance information associated with a particular link design that uses the equipment along a link. The system may then use these two inputs to determine the actual link capacity of the link the user seeks to design. The system may then provide the link capacity estimate to the user.

The disclosed technology allows for making use of patterns of uncertainty within a system which can result in increased reliability of a prediction without sacrificing the overall system utilization and associated cost efficiency. In addition, the disclosed technology enables learning and understanding the composite effects of elements in the system on the overall predictability of optical performance.

The disclosed technology allows for generational improvements in optical transponder capacity to be handled and simulated. Optical transponder capacity is becoming more liquid, i.e., the ratio between symbol rate or speed of the signal and the line rate granularity increases from generation to generation. As a consequence, variations in signal-to-noise ratio (SNR) translate more often into net capacity gains that are achieved without increasing the cost of the system. The disclosed technology allows for a set of individualized or tailored margins through the use of machine learning which can lower the overall margin as compared to a "one-size fits all" approach, to allow for capacity unit cost reduction.

The disclosed technology involves the use of ML to handle uncertainties and correct performance prediction allows for a reduction in the time required to perform link design by using simpler numerical models. In this regard, the accuracy of numerical models used for optical link design is proportional to their computation time. The disclosed technology also enables the handling of uncertainties and to correct the predictions based on physics related-or numerical simulations of optical link designs in a timely and less computationally intensive manner.

The disclosed technology allows for computationally efficient retraining of trained machine learning models upon the introduction of a new link feature such as a new network component or new hardware components being introduced into an existing or new optical network. The use of machine learning models allows for a generic end-to-end or overall cumulative effect of a new hardware feature on a network to be used to retrain a machine learning model rather than the need of detailed performance characteristics associated with the new hardware component which would be fed to a numerical or physics based simulation model.

The disclosed technology mitigates issues related to general estimates or inaccurate simulations by replacing "one size fits all" margining with more granular and accurate margin estimates of optical components and an optical system through the use of machine learning. In some examples, factors which may influence the uncertainty of the overall capacity of an optical system may include, without limitation, fiber type, transmission frequency, transponder type, transponder mode, amplifier type, amplifier configuration, and optical node types. In some examples, these factors can be measured and provided as inputs to train a machine learning model. The model can also take a simulated performance of the network as an input. By being provided both the empirically observed performance of an optical network as well as the simulated performance of the network, the model can identify parameters, a set of parameters, or conditions under which the physics-model prediction is overly optimistic or pessimistic in terms of the true capacity of the network, and can either reduce or increase the margin for the simulated prediction.

The disclosed technology can include training a machine learning model. The machine learning model can be trained based on a variety of inputs. The inputs can include features related to an optical link, including identified or hidden features, including but not limited to the optical link components, optical link topology, and meta-data or other data associated with the optical link. The input can include an output provided from a simulation of the optical link, such as for example, based on the Gaussian noise model (GN model) or other numerical techniques computing a generalized signal-to-noise ratio (GSNR) or another comparable metric. The input can also include empirically collected performance metrics from an optical link, including but not limited to Q values. In some examples, the empirically collected performance metrics may be converted to GSNR values. In some examples, the machine learning model can determine differences between the empirically measured and derived GSNR values in conjunction with link features as part of training. For example, the shift between the predicted GSNR value by simulation and the likely observed GSNR value in actual deployment can be studied or analyzed as part of the prediction of uncertainty of a given set of features.

The disclosed technology can include analyzing clusters in the feature space to determine prediction error variances. Without limitation, a feature can be an independent variable, a variable derived from one or more independent variables, or a dependent variable which is related to a GSNR prediction or GSNR prediction error. Clusters may form in the feature space, such as for example, in the feature space of "frequency." The distribution of prediction errors can be observed or analyzed within each cluster. Some clusters may show larger variances than others. Information related to the clusters can be used to predict the uncertainty of a prediction given a certain set of features.

In some examples, an output of the ML model given a set of features and a simulation output of said features is the expected deviation of the simulated GSNR from the observed GSNR and the distribution of the expected deviation. The distribution of the expected distribution can represent an uncertainty or error bar to the deviation.

The disclosed technology can include testing a machine learning model. In some examples, a machine learning model can be tested on a different optical link than the optical link upon which the model was trained. A simulated GSNR of the optical link and link features can be provided to a trained machine learning model, which can output a GSNR. The trained machine learning model can apply GSNR corrections to the simulated GSNR data. The model can provide a GSNR with variability data or confidence intervals for the GSNR data. The same optical link can also be empirically measured for performance metrics, which can be converted into a GSNR. A comparison output from the machine learning model and the empirically measured GSNR data can be performed to assess prediction accuracy.

The disclosed technology allows for generating information related to an optical link by using the machine learning model. The machine learning model can take as inputs a set of link features associated with the optical link to be simulated and a GSNR from a simulation of the optical link. The machine learning model can output one or more GSNR values for a given set or subset of link features. Information related to the generated GSNR can be represented as a probability distribution function and a "margin" based on a shift of the probability distribution function can be determined based on preferences from the operator or owner of the optical link.

As further described below, the technology allows for a more accurate margin by adjusting a physics simulation of an optical network with the results of a trained machine learning model to more accurately match the adjusted simulation results to a "truer" performance of the optical network. The trained machine learning model can provide prediction errors from the physics simulation of the optical network which, when applied to the results of the physics simulation, correct the results of the simulation and more closely tailor them to a "truer" or empirical performance driven model of the optical network.

In some examples, a link, an optical link, optical communication link, an optical network, a network, or optical communication system may be used interchangeably. In addition, link parameters and link features can be used interchangeably in some examples.

Example Systems and Methods

FIG. 1 illustrates a schematic view of an optical communication system or optical communication link according to aspects of the disclosed technology.

Illustrated in FIG. 1 is a schematic view of network 100. Network 100 can be an optical communication link or an optical network. Network 100 can be made up of one or more network components. Illustrated in FIG. 1 are various exemplary network components, such as optical node 105, optical transponder 110, optical amplifier 115, optical fiber span 120. Any arbitrary component can be part of network 100 and the examples given are only exemplary. Each network component may be of a particular type or sub-type, which as explained herein, can be used as part of machine learning algorithms or training a machine learning model. For example, an optical node can be a reconfigurable optical add-drop multiplexer (ROADM), Intermediate Line Amplifier (ILA), a Dynamic Gain Equalizers (DGE). As another example, amplifiers can be Erbium-Doped Fiber Amplifiers (EDFA), Raman amplifiers, or a combination thereof. As yet another example, fiber types can be standard single-mode fiber (SSMF) or large effective area fiber (LEAF) optical fiber. In addition, other components can have other settings, sub-types, or modes of operation. The network may also have different configurations, such as channel frequencies, power spectral densities, and an order to optical nodes and fiber spans. For example, the performance of an optical network made of two spans, S1 and S2, with two different fiber types, F1 and F2, and two different node types N1 and N2 The performance of a link from S1 to S2 is not necessarily as the performance of the as the link from S2 to S1. There need not be a commutative property between the spans of an optical link.

Network 100 can also be described as a set of intra-related network components arranged or combined in a particular way. A set of link features can also be derived from network 100. A link feature can be thought of as a variable or parameter related to the network. For example, the link features can be thought of as a set of variables, wherein each variable can take a value from a known set. For instance, type of ROADM, or ROADM configuration, can be one variable, which can take a value from a discrete set of values. As another example, an optical amplifier configuration can be another variable, which can take a value from a continuous set of values, such as a dB. As another example, the type of optical amplifier can be another variable. A fiber coupler can be another variable which can have a value which defines the loss of the fiber coupler. In some examples, the set of link features can be represented by a set of variables, such as {X1, X2, X3, . . . Xn}, wherein each variable can take on a value from a known range or set of values.

Non-limiting examples of link features include the above described characteristics, including type of optical node, amplifier, or fiber, channel frequencies, power spectral densities, and order of optical nodes, and fiber spans. Other link features can be derived from empirically measured link features or known parameters related to the optical link. Additional non-limiting examples of link features can include cumulated chromatic dispersion, cumulated gain profiles, gain responses of a single span, gain responses of multiple spans, frequency response (such as for example, gain, attenuation, noise figures) of individual spans or of the system as a whole.

Each network element of network 100 can also have a set of values which are provided by a network equipment manufacturer (NEM). These values can be used to simulate or approximate the behavior of network 100. However, these values approximate the true value or behavior of each component. Thus, even collectively the provided parameters can only approximate the true behavior of network 100.

Figure 2:
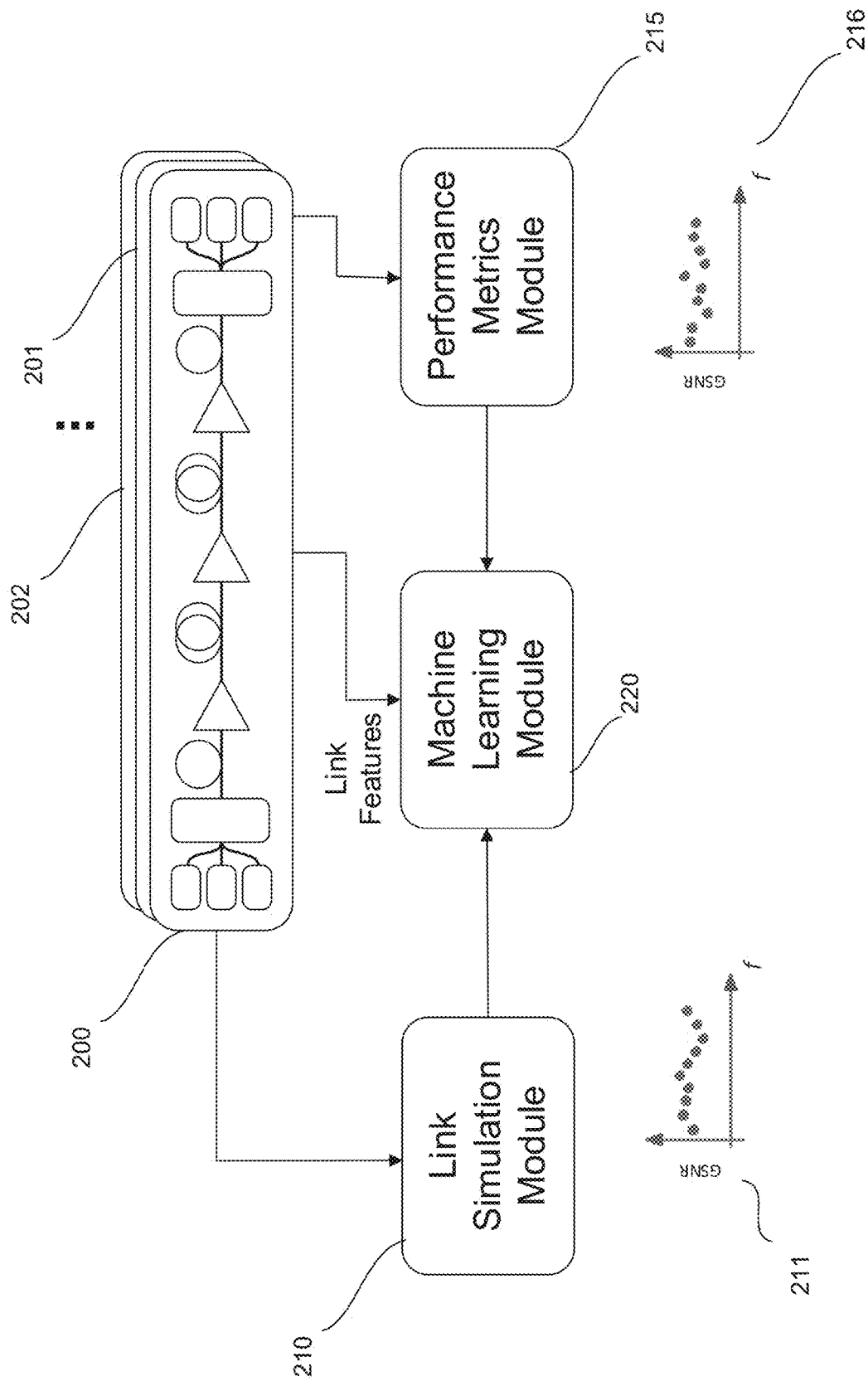
FIG. 2 illustrates a schematic view of an architecture for training a machine learning model according to aspects of the disclosed technology.

FIG. 2 illustrates a schematic view of an architecture for training a machine learning model according to aspects of the disclosed technology. Illustrated in FIG. 2 are network 200, network 201, and network 202. Although only three networks are depicted from simplicity, a person of skill in the art will understand that any number of networks can be used for training a machine learning model.

Each network can be an optical network and similar to network 100, and composed of a number of optical or network components. In this manner, each network can have a unique set or value for link features which form a signature for that network. Various metrics or values can be derived from the link features of each network.

Information of each network, 200-202, can be provided to a link simulation module 210. A link simulation module can contain a physics based model which can simulate the performance of a network based on the provided features of the network, such as the link features described above. A link simulation module will simulate various metrics related to a network. The simulation can output a generalized signal to noise ratio (GSNR) which can be a combination of linear and nonlinear signal to noise ratios. As explained above, a link simulation module is only an approximation of the complicated optical physics occurring within an optical network. The link simulation model can rely on NEM provided data regarding the link components or link features. Further, it is often not possible or practical to obtain precise individual optical properties of every optical network component which depends on the optical physics, intra-component relationships, and unique characteristics of the deployed hardware. Even complicated and sophisticated simulation engines rely on a simplified model of the physics and interactions within an optical network or optical link, leading to an imperfect simulated prediction.

In addition, each simulation model may contain different biases and assumptions, leading to inaccurate simulations for a particular optical link. It is further not possible to obtain an accurate model which can account for all intra-component relationships which depend on complicated optical physics. However, link simulation model 210 can provide a rough estimate of certain features of the optical network. As one example, link simulation model 210 can create or output GSNR as a function of frequency of the optical channels propagating through the fiber network, such as that depicted in graph 211, for a particular network.

Non-limiting examples of physics simulation engines which can be part of link simulation module 210 include a GN model, an EGN model, a split step Fourier transform method or model, a volterra series nonlinear expansion method or model.

Information of one or more networks, such as networks 200-202 can be provided to performance metrics module 215. Performance metrics module 215 can store empirical data related to each network. The performance metrics module 215 can store or output a graph empirically measured GSNR as a function of frequency, such as that depicted in graph 216, for a particular network. It is expected that for a specific metric or parameter of a specific network, the information obtained from performance metrics module 215 will differ from that value provided by link simulation module 210.

In some examples, performance metric module 215 can collect or extract Q values, and other values associated with the network, such as cumulated dispersion. In some examples, Q values can be considered as a proxy or related to a bit error ratio and provides a metric for measuring the quality of eye diagrams in optical systems. The bit error ratio can provide information about the quality of a transmission metric for a communication channel. A person of skill in the art will appreciate that the preceding values or metrics are exemplary and any suitable metric related to the network can be collected.

Machine learning module 220 can contain various machine learning algorithms or models, as further described herein. Machine learning module 220 can receive various inputs to train one or more machine learning models. For a particular network, machine learning module 220 can obtain the outputs of link simulation module 210, the empirically observed data associated with performance metrics module 215, as well as link features which can be gleaned or extracted from the network.

Machine learning module 220 may include neural networks and neural nets. The machine learning module can contain machine learning models which can be trained using a set of training data. In some examples and without limitation, the machine learning module or machine learning algorithms can contain or be made of any combination of a convolution neural network, a perceptron network, a radial basis network, a deep feed forward network, a recurrent neural network, an autoencoder network, a gated recurrent unit network, a deep convolutional network, a deconvolution network, or a support vector machine network.

Figure 3:
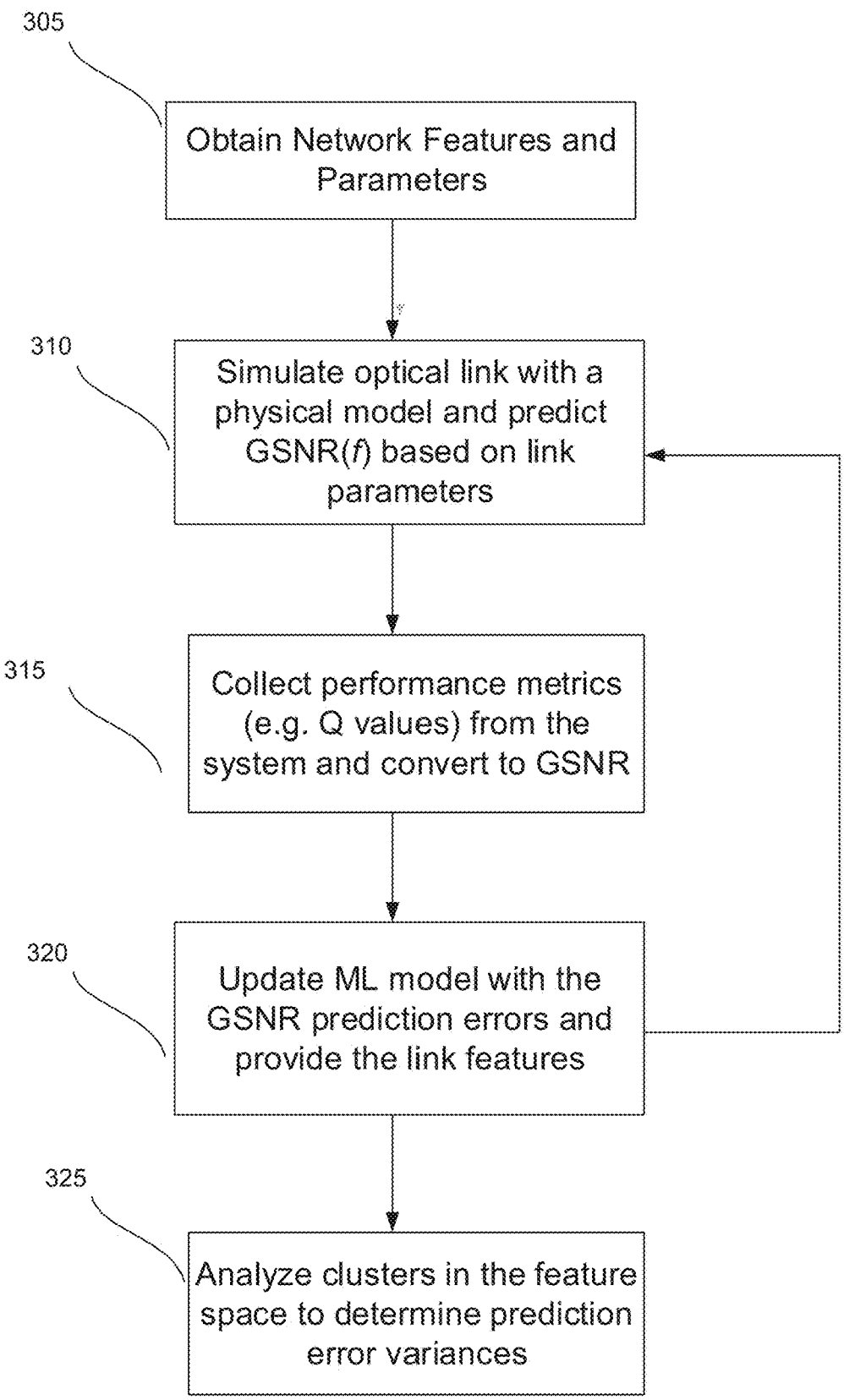
FIG. 3 illustrates an example diagram related to training a machine learning model according to aspects of the disclosed technology.

FIG. 3 illustrates an example diagram related to training a machine learning model according to aspects of the disclosed technology. The steps described with respect to FIG. 3 can be applied to one or more optical networks or performed iteratively to train a ML model.

At block 305, features or parameters related to an optical network can be obtained. This can include without limitation network features, link features, or other information related to an optical network. Example link features can include network topology information, such as how a link looks like in terms of a sequence of fiber and nodes, configuration information, such as the launch power of a fiber set determined by an amplifier, or telemetry information, such as Q factors or chromatic dispersion. Telemetry information can be collected here and then used at block 315 or later be collected at block 315.

At block 310, an optical link can be simulated. In some examples, the optical link can be simulated with one or more physical models which model or approximate the behavior of the optical link, such as with link simulation module 210. One or more link parameters or metrics related to the optical link can be obtained. For example, a function such as GSNR(f), GSNR as a function of frequency, can be obtained based on the link parameters.

At block 315, performance metrics related to a network can be collected and obtained, and converted or transformed into GSNR values or GSNR(f). Performance metrics can be collected by performance metrics module 215 for example.

At block 315, a GSNR prediction error value can also be calculated from the information obtained at block 315 and block 310. For example, a GSNR prediction error value can be the difference between the predicted GSNR value or GSNR(f) values for a network and the empirically observed GSNR value or GSNR(f) values.

At block 320, a ML model can be updated or trained with GSNR prediction error value(s) as well as with link features related to a network. As explained with respect to FIG. 2, one or more ML models can be trained as part of a machine learning module.

As one example, training of the machine learning model can include the machine learning model observing the GSNR prediction error values for a set of features. The machine learning model can take as inputs the GSNR prediction error values and the set of link features for many networks. After training, the machine learning model can then generalize and have predictive ability to predict the GSNR prediction error value for a new network. In some examples, the machine learning model can look for hidden variables. Hidden variables are variables which are not observed, measured, or explicitly identified as link features. Models with hidden variables can also be referred to as latent variable models. Non-limiting examples of machine learning techniques which can be used include supervised learning, unsupervised learning, linear or nonlinear regression techniques, or clustering. For example, the clustering techniques can include SVMs, K-Means, k-Nearest Neighbors, or random forest techniques. However, a person of skill in the art will appreciate that a variety of machine learning and other techniques can be used.

In some examples of machine learning, the link or network can be treated as a "black box" and a prediction error can be trained to learn the uncertainty of a cumulative GSNR output for a physics simulation of that link or network. In this example, there may be effects that are not modeled by the physics simulation or machine learning model which contribute to the overall prediction error and/or uncertainty. These hidden features may not explicitly be known but may be correlated with a known feature. For example, a particular hidden or unmodeled effect can be stronger in a particular type of amplifier as compared to other amplifiers.

In other examples, the machine learning model can be designed or configured to attempt to learn a prediction error to the characteristics of every known and modeled component of the optical link used or provided to the physics model of the optical link. The combined effect of all the individual prediction errors of every component can be used to predict the observed deviation between the physics model (end-to-end simulation output) and observed field data. In this example, there may be hidden features which can contribute to prediction errors. If such hidden features are with certain known features or components of the link, the machine learning model can account for such variance.

At block 325, clusters in the feature space can be analyzed to determine variance in prediction errors of the ML model. The feature space can be thought of as the space of all features observed or measured related to a network. Within the feature space, certain independent features, or values for groups of features can form a mathematical space. As one example, two features, such as for example, fiber type and transponder type, can form a two dimensional feature space. The feature space can be abstracted out to any n-dimensional space. Within the feature space, GSNR prediction error values, which can be the difference between the value generated by the physics model and the empirically obtained value, can be mapped in the feature space, and certain GSNR prediction error values can be seen to cluster around certain values within the feature space.

In some examples and with reference to other Figures described herein, a machine learning model can output a prediction error for an optical network based on the known link features of that optical network. In some examples, the machine learning model can identify or classify the optical network as part of a previously learned cluster and assign an uncertainty based on the classification.

Figure 4:
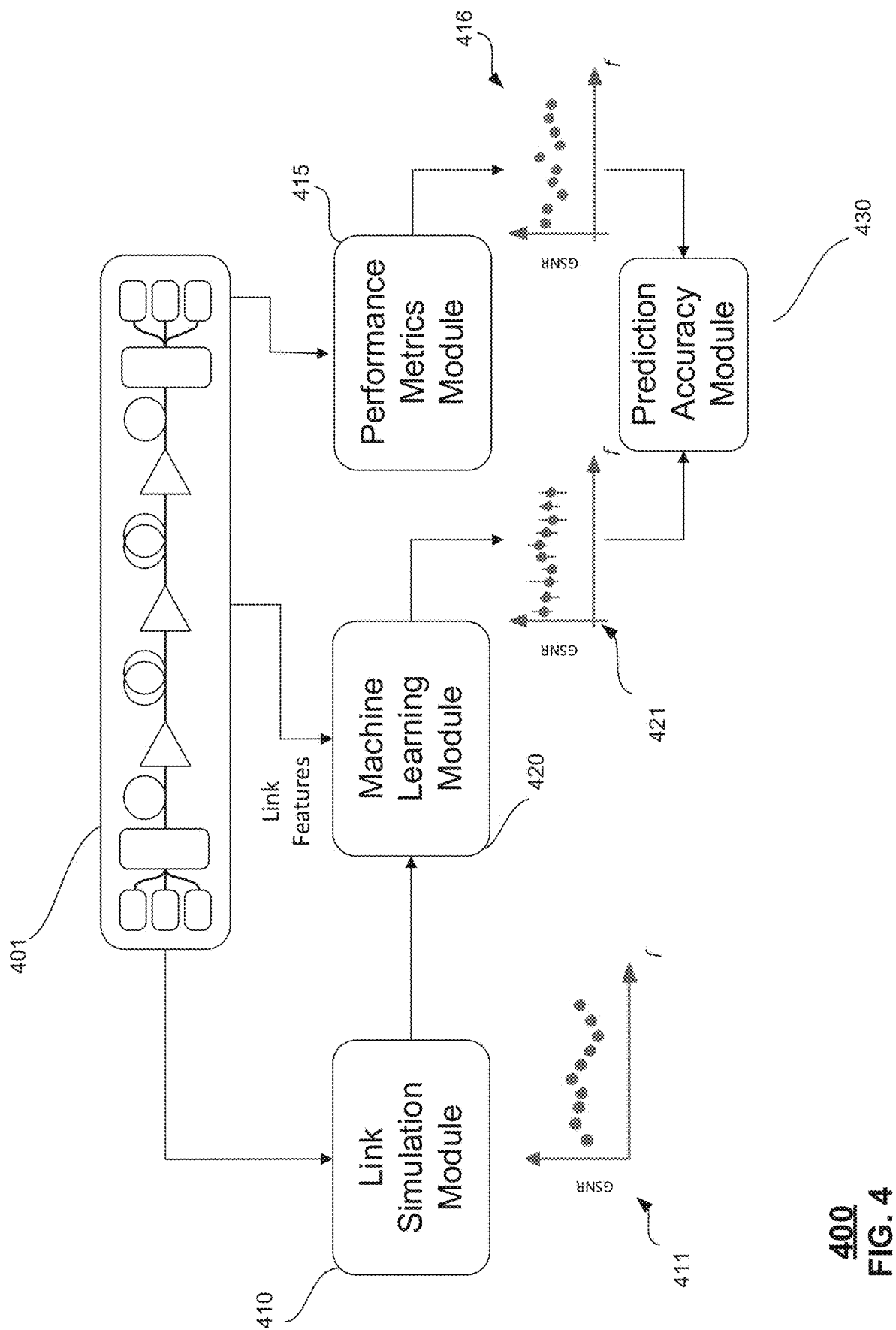
FIG. 4 illustrates a schematic view of an architecture for testing a machine learning model according to aspects of the disclosed technology.

FIG. 4 illustrates a schematic view of an architecture for testing a machine learning model according to aspects of the disclosed technology. Arrows between various elements of FIG. 4 indicate a flow of information between various modules.

FIG. 4 illustrates an optical link 401, a link simulation model 410, a performance metrics module 415, a machine learning module 420, and a prediction accuracy module 430. Graphs 411, 416, and 421 are associated with link simulation model 410, performance metrics module 415, and machine learning module 420 respectively. Link simulation model 410, a performance metrics module 415, a machine learning module 420, graph 411, graph 416 can be similar to link simulation model 210, performance metrics module 215, machine learning module 220, graph 211, and graph 421 respectively. As can be seen in FIG. 4, the data from performance metrics module 415 is not provided to machine learning module 420 and is rather used to test the accuracy of the trained machine learning module.

In some examples, optical link 401 will be a link which was not used to train the machine learning model and can act as a "test" case to test the accuracy of the ML model and the training of the ML model.

Graph 421 can be an output of a trained machine learning model of machine learning module 420, such as one trained by the methods described with respect to FIG. 2 and FIG. 3. Graph 421 can represent the output of the machine learning model and can represent GSNR as a function of frequency. As can be seen in FIG. 4, the GSNR values can contain error bars to represent the uncertainty present within the machine learning predictions for GSNR or GSNR(f).

Prediction accuracy module 430 can compare the output of machine learning module 420 with the output of performance metrics module 415. The output of performance metrics module 415 is considered to be the "true" value for GSNR(f). The accuracy or quality of the predictions with respect to one or more outputs of the ML module can be obtained by using a root mean square error method. Uncertainty can be determined or evaluated by looking at prediction errors acquired over multiple training optical networks.

In some examples, there can be multiple outputs by a machine learning module, such as an expected prediction error and a variance based on an identified cluster. In some examples, an output from multiple outputs of a machine learning module can be chosen by a machine learning classifier. A machine learning classifier can also be part of machine learning module 420 or be a separate module. Additional examples of outputs by the ML module 420 are provided herein. In some examples, there can be two outputs by the machine learning module, such as the expected prediction error and the variance for the particular prediction, which in some examples can be based on the cluster identified for the new optical link. In some examples, both of these outputs can be used to adjust or determine margin.

Figure 5:
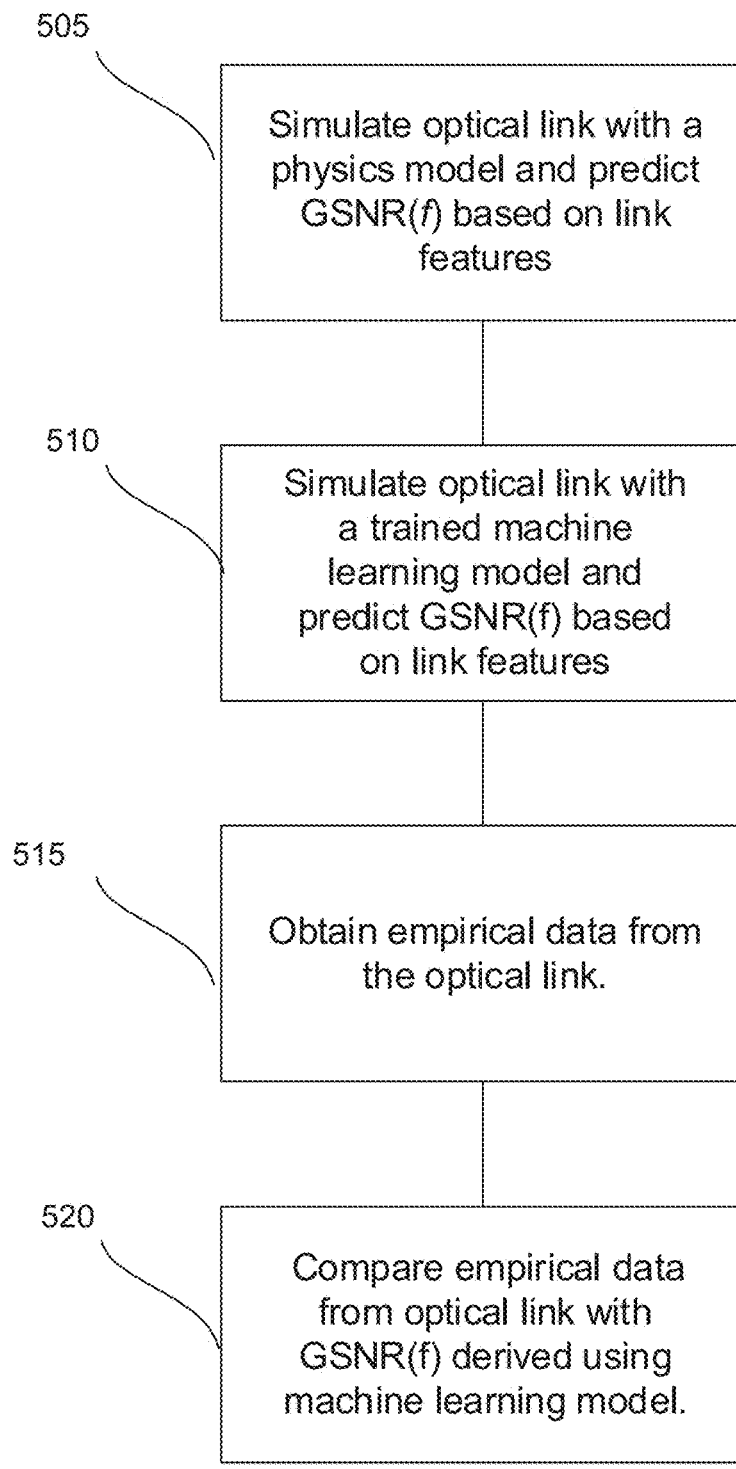
FIG. 5 illustrates an example diagram related to testing a machine learning model according to aspects of the disclosed technology.

FIG. 5 illustrates an example diagram related to testing a machine learning model according to aspects of the disclosed technology.

At block 505, an optical link can be simulated using a physics model. The optical link can be a link which was not used to train the machine learning model which is to be tested. The link can be simulated to predict GSNR(f) based on the link features provided to the physics model. The link can be simulated to predict GSNR(f) based on the link parameters provided to the physics model.

At block 510, an optical link, or related parameters, such as GSNR(f) corrections, can be simulated or generated using a trained machine learning model. The trained machine learning model can take link features from the optical link and output GSNR(f) or another metric related to the optical link. The trained machine learning model can also take as an input the GSNR(f) produced at block 505.

At block 515, empirical data from the optical link can be obtained. For example, the empirical data can be obtained by performance metrics module 415 referenced in FIG. 4.

At block 520, the empirical data from the optical link can be compared with the GSNR(f). In some examples, this step can occur in prediction accuracy module 430 references in FIG. 4.

In some examples, method 500 can be performed on a large number of test optical links to obtain a robust characterization of the performance of the trained machine learning model, including the range of values in which the trained machine learning model is valid or expected to give results within a certain error range.

Figure 6:
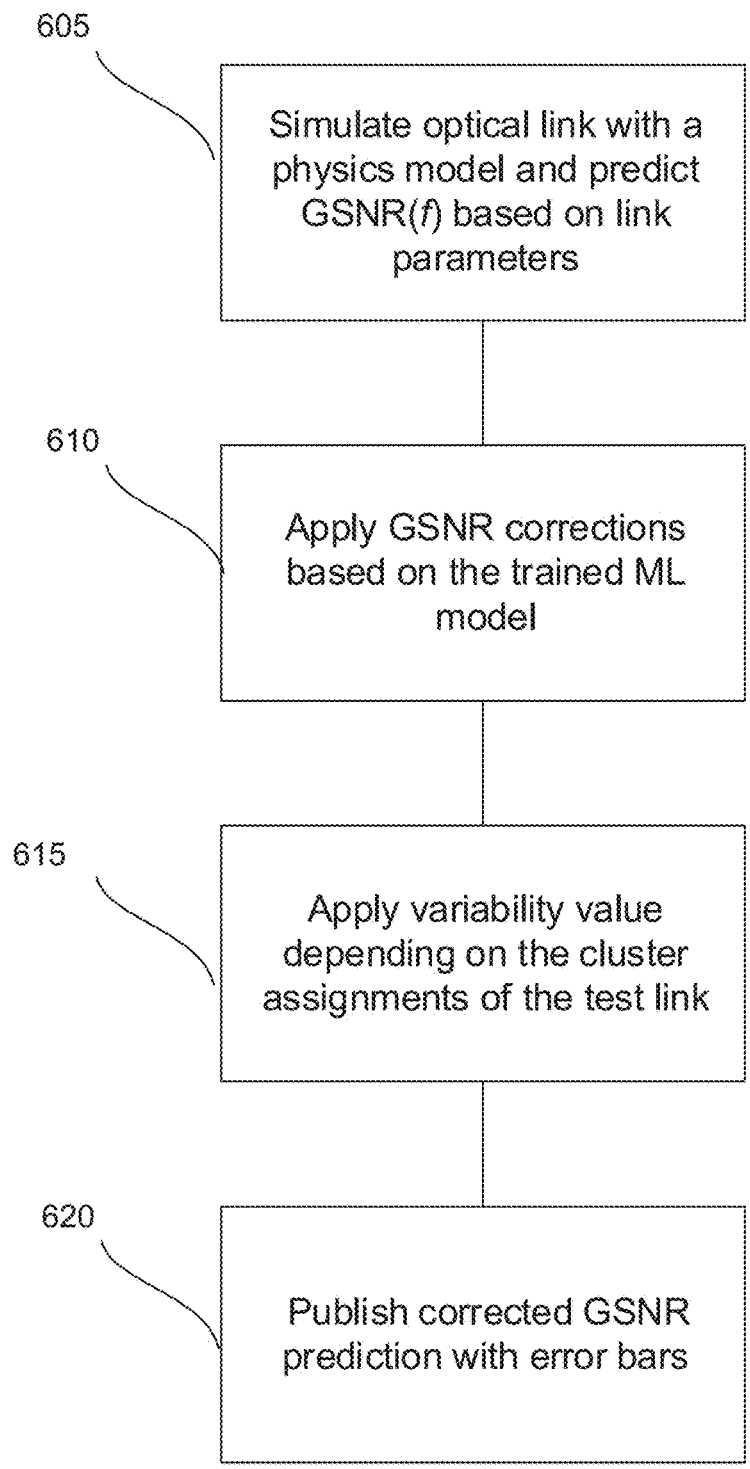
FIG. 6 illustrates an example diagram related to using a machine learning model for predictive purposes according to aspects of the disclosed technology

FIG. 6 illustrates an example diagram related to using a machine learning model for predictive purposes according to aspects of the disclosed technology, method 600. For example, method 600 can be used to simulate the behavior or performance characteristics of a designed but not yet built optical network to understand its performance characteristics. For example, the network can be designed with a certain throughput or total capacity. As method 600 can give a more accurate understanding of the performance of the network, it is possible to modify the designed network to reach a lower cost per capacity of the network. In other examples, method 600 can enable without sacrificing the reliability of the prediction, the number of instances in which the network performance is overestimated or underestimated.

At block 605, an optical link can be simulated using a physics model or numerical model. The link can be simulated to predict GSNR(f) based on the link features provided to the physics model.

At block 610, GSNR corrections can be applied based on the output of the trained machine learning model. The machine learning model can output GSNR corrections based on the provided link features of the optical link simulated in block 605. The trained machine learning model can also take as an input the GSNR(f) produced at block 605. As the trained machine learning model can indicate whether the physics based simulation was optimistic or pessimistic, it can accordingly correct the results of the model.

At block 615, variability values can be applied. Variability information can be obtained by analyzing potential clusters in a feature space. Each cluster within a feature space can be associated with a specific variability across estimations and empirical data of the set of optical links used for training the machine learning model. After classification of a new link, by assigning certain values to certain clusters, the corresponding cluster variability may be reported.

At block 620, a corrected GSNR prediction can be generated based on the output from the physics model, the corrections derived from the machine learning model, and the variability values obtained from block 615. The corrected GSNR predictions can include the expected value of the prediction as well as a variability associated with the prediction. In some examples, the corrected GSNR predictions can be published as a graph of GSNR(f) with error bars, similar to graph 421. Information related to the generated GSNR can be represented as a probability distribution function and a "margin" based on a shift of the probability distribution function can be determined based on preferences from the operator or owner of the optical link.

Figure 7:
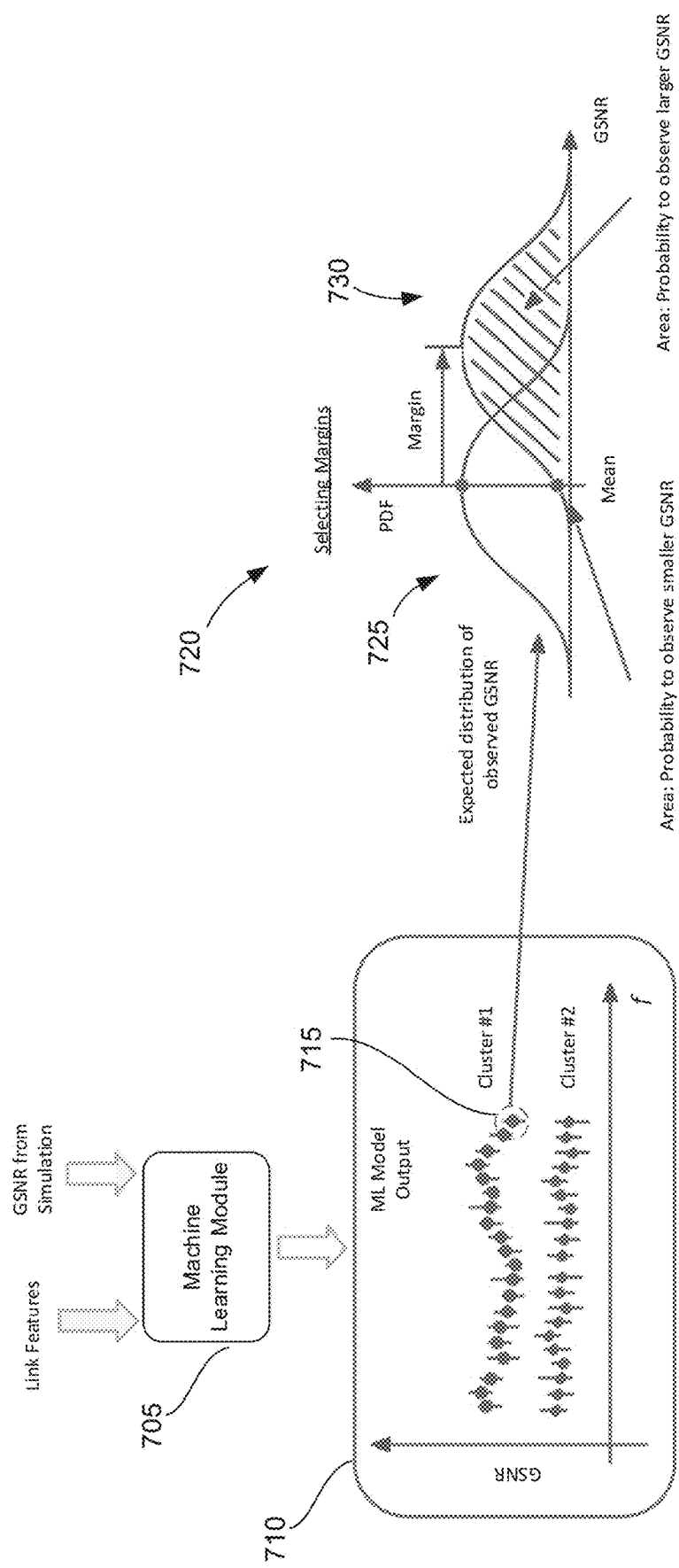
FIG. 7 illustrates an example diagram related to predicting an optical communication link according to aspects of the disclosed technology.

FIG. 7 illustrates an example diagram related to predicting and adjusting margins of an optical communication link.

As illustrated in FIG. 7, and explained above, a machine learning module, such as machine learning module 705, can receive a set of link features and a GSNR from a physics simulation of the link. Machine learning module 705 can output data from which a graph of GSNR(f), such as graph 710, can be generated. The graph can be generated using any of the techniques described herein, such as those explained with reference to FIG. 6. Graph 710 illustrates two clusters, which can be the output of a machine learning model 705 as explained herein. Although graph 710 and the associated clusters illustrated for a visual representation of the output of a machine learning module, a person of skill in the art will understand that equivalent information can be output by the machine learning module in a binary or any other suitable format. While only two clusters are shown, multiple clusters can be produced as an output or as part of processing by a trained machine learning model. As a simplified example, the two clusters may differ in a single property, such as a different optical fiber type. Although only two clusters are shown, In some examples, one of the clusters can be chosen to represent the behavior of the optical network to be chosen. In other examples, the machine learning module 705 can output a multi-dimensional feature space and a point or multiple points, to which a new optical network can be classified based on machine learning or classification techniques. For example, the machine learning module can output a number of potential graphs to which a new optical network can be matched or fitted. In yet other examples, no classification is necessary and the machine learning module can output the cluster representing the "true" behavior of the new optical link directly.

Each point within a cluster, within graph 710 can be associated with or represented as a probability distribution function (PDF). For example, data point 715 is represented as graph 720 with curve 725. Although curve 725 is not directly empirically obtained from direct measurement of an optical network, curve 725 can be thought to be the "true" behavior of the simulated optical network as it is generated using a trained machine learning model. In some examples, curve 725 can be approximated to be Gaussian, while in other examples, other shapes or characteristics, such as skew, shape, or type are associated with curve 725.

As curve 725 is thought to be the "true" performance characteristic, a "margin" or shift can be applied to graph 720 to shift the curve 725 along the horizontal GSNR axis. Curve 730 represented the shifted curve 725. This margin or shift can be selected based on a probability density function of curve 725 or other mathematical characteristics to shift the curve sufficiently to ensure that there is enough margin within the network. The size of the margin can be selected based on reliability characteristics, quality of service requirements, or engineering needs. The shaded area of curve 730 represents the probability of obtaining a value above the mean while the unshaded area to the left of the mean value represents the probability that the GSNR will be lower than the mean. By applying a positive margin the distribution can be shifted, adjusting the balance between over or underestimating a GSNR value. The probability of underestimating GSNR is a function of the applied margin and can be chosen based on the risk averseness of the operator or can be applied by a computing device using a defined parameter.

Figure 8:
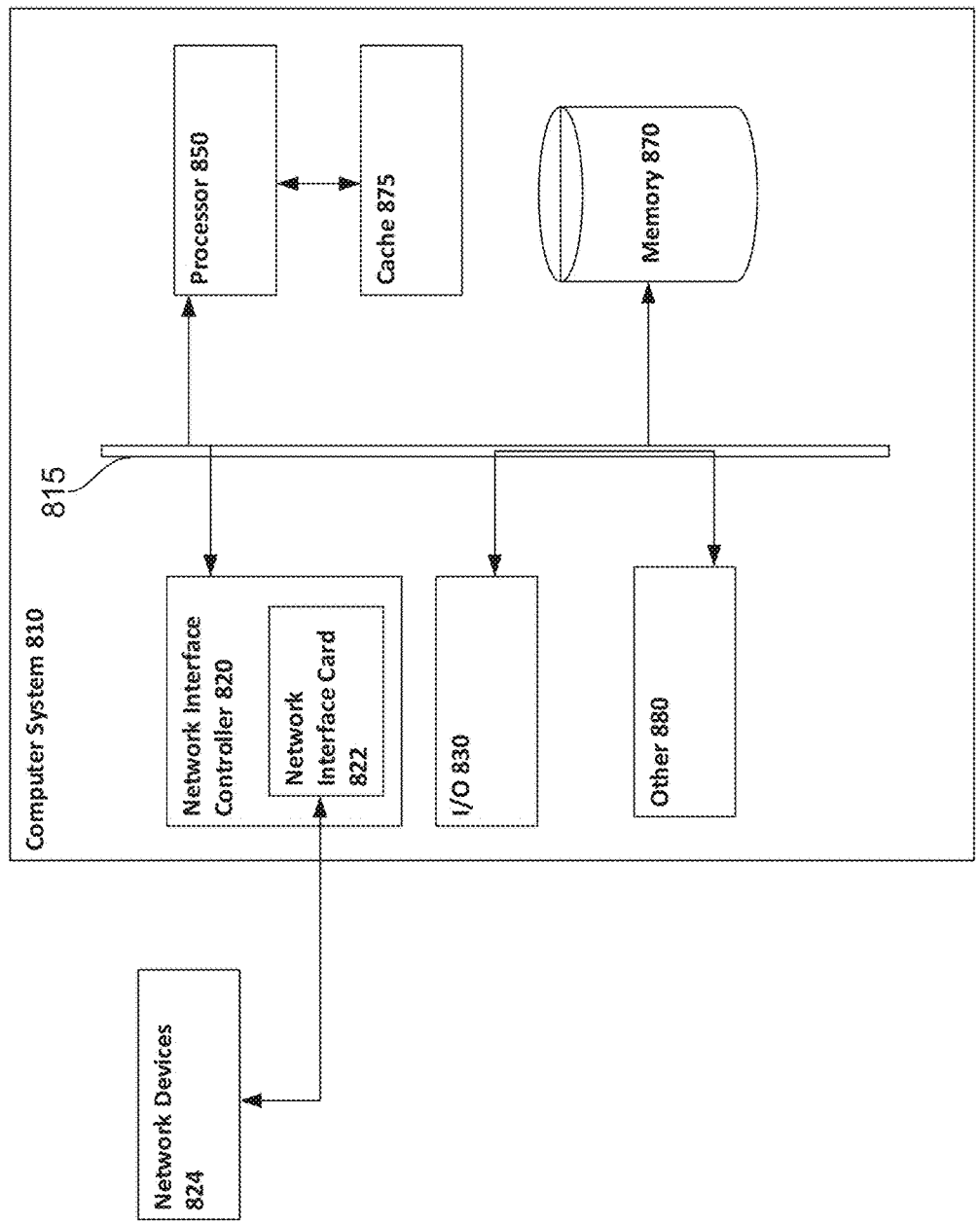
FIG. 8 illustrates an example computing system according to aspects of the disclosed technology.

FIG. 8 is a block diagram 800 illustrating an example computer system 810 with which aspects of this disclosure, including the machine learning systems and techniques described herein, and any components thereof, can be implemented. In certain aspects, the computer system 810 may be implemented using hardware or a combination of software and hardware, either in a dedicated server, or integrated into another entity, or distributed across multiple entities. In some examples, example computing system 810 can be a user computing system or device.

In broad overview, the computing system 810 includes at least one processor 850 for performing actions in accordance with instructions and one or more memory devices 870 or 875 for storing instructions and data. The illustrated example computing system 810 includes one or more processors 850 in communication, via a bus 815, with at least one network interface driver controller 820 with one or more network interface cards 822 connecting to one or more network devices 824, memory 870, and any other devices 880, e.g., an I/O interface. The network interface card 122 may have one or more network interface driver ports to communicate with the connected devices or components. Generally, a processor 850 executes instructions received from memory.

The processor 850 illustrated incorporates, or is directly connected to, cache memory 875.

In more detail, the processor 850 may be any logic circuitry that processes instructions, e.g., instructions fetched from the memory 870 or cache 875. In many embodiments, the processor 850 is a microprocessor unit or special purpose processor. The computing device 810 may be based on any processor, or set of processors, capable of operating as described herein. The processor 850 may be a single core or multi-core processor. The processor 850 may be multiple processors. In some implementations, the processor 850 can be configured to run multi-threaded operations. In some implementations, the processor 850 may host one or more virtual machines or containers, along with a hypervisor or container manager for managing the operation of the virtual machines or containers. In such implementations, the methods shown and described above or the electronics described above can be implemented within the virtualized or containerized environments provided on the processor 850 or otherwise operate in conjunction with processor 850.

The memory 870 may be any device suitable for storing computer readable data. The memory 870 may be a device with fixed storage or a device for reading removable storage media. Examples include all forms of non-volatile memory, media and memory devices, semiconductor memory devices, such as EPROM, EEPROM, SDRAM, and flash memory devices, magnetic disks, magneto optical disks, and optical discs, such as CD ROM, DVD-ROM, and Blu-ray® discs. A computing system 810 may have any number of memory devices 870. In some implementations, the memory 870 supports virtualized or containerized memory accessible by virtual machine or container execution environments provided by the computing system 810.

The memory 870 can contain one or more modules described herein, such as for example and without limitation, link simulation module 210, machine learning module 220, performance metrics module 215, and prediction accuracy module 430.

The cache memory 875 is generally a form of computer memory placed in close proximity to the processor 850 for fast read times. In some implementations, the cache memory 875 is part of, or on the same chip as, the processor 850. In some implementations, there are multiple levels of cache 875, e.g., L2 and L3 cache layers.

The network interface driver controller 820 manages data exchanges via the network interface driver 822 (also referred to as network interface driver ports). The network interface driver controller 820 handles the physical and data link layers of the OSI model for network communication. In some implementations, some of the network interface driver controller's tasks are handled by the processor 850. In some implementations, the network interface driver controller 820 is part of the processor 850. In some implementations, a computing system 18 has multiple network interface driver controllers 820. The network interface driver ports configured in the network interface card 822 are connection points for physical network links. In some implementations, the network interface controller 820 supports wireless network connections and an interface port associated with the network interface card 822 is a wireless receiver/transmitter. Generally, a computing device 810 exchanges data with other network devices 824 via physical or wireless links that interface with network interface driver ports configured in the network interface card 822. In some implementations, the network interface controller 820 implements a network protocol such as Ethernet.

The other network devices 824 are connected to the computing device 810 via a network interface driver port included in the network interface card 822. The other network devices 824 may be peer computing devices, network devices, or any other computing device with network functionality. For example, a first network device 824 may be a network device such as a hub, a bridge, a switch, or a router, connecting the computing device 810 to a data network such as the Internet.

The other devices 880 may include an I/O interface, external serial device ports, and any additional co-processors. For example, a computing system 18 may include an interface (e.g., a universal serial bus (USB) interface) for connecting input devices (e.g., a keyboard, microphone, mouse, or other pointing device), output devices (e.g., video display, speaker, or printer), or additional memory devices (e.g., portable flash drive or external media drive). In some implementations, a computing device 800 includes an additional device 880 such as a coprocessor, e.g., a math co-processor can assist the processor 850 with high precision or complex calculations.

Instructions on computing system 810 may control various components and functions of computing system 810. For example, the instructions may be executed to perform any of the methods indicated in this disclosure. In some examples, algorithms can be included as a subset of or otherwise as part of instructions included on computing system 810. Instructions can include algorithms to execute any of the methods or a subset of the methods described within this disclosure.

User interfaces on the computing system 810 may include a screen which allows a user to interact with computing system 810, such as a touch screen or buttons. A display can also be included such as an LCD, LED, mobile phone display, electronic ink, or other display to display information about computing system 810. The user interface can allow for both input from a user and output to a user. A communication interface(s) can include hardware and software to enable communication of data over standards such as Wi-Fi, Bluetooth, infrared, radio-wave, and/or other analog and digital communication standards. Communication interface(s) allow for computing system 810 to be updated and information generated by computing system 810 to be shared to other devices. In some examples, communication interface(s) can send information stored in memory to another user device for display, storage or further analysis.
Example Machine Learning, Statistical, Probabilistic, and Model Creation Methods In some examples, one or more of the following techniques can be used as part of the disclosed technology to train a machine learning model or to utilize a trained machine learning model to obtain an output.

In some examples, probabilistic methods can be used. For example, a gaussian mixture model can be used. Gaussian mixture models are a probabilistic model for representing normally distributed subpopulations within an overall population. In a Gaussian mixture model, it is not required that an observed set of data should characterize or state which subpopulation a particular observation within the distribution belongs to.

Example machine learning techniques which can be used include the following.

In some examples, a mix of supervised learning techniques and unsupervised learning techniques can be used.

In some examples, generative adversarial networks can be used to predict or detect certain features. Generative adversarial networks use two networks, one adversarial and one generative, in an attempt to fool the adversarial network by objects generated by the generative network.

In some examples, clustering methods can be used to cluster inputs, network parameters, trained models, or virtual machines. Clustering methods can be used in real time to classify and match models or groups of models. Clustering can be an unsupervised machine learning technique in which the algorithm can define the output. One example clustering method is "K_Means" where K represents the number of clusters that the user can choose to create. Various techniques exist for choosing the value of K, such as for example, the elbow method.

Some other examples of techniques include dimensionality reduction. Dimensionality reduction can be used to remove the amount of information which is least impactful or statistically least significant. Dimensionality reduction can be used in conjunction with any of the techniques described herein. One example dimensionality reduction method is principle component analysis (PCA). PCA can be used to reduce the dimensions or number of variables of a "space" by finding new vectors which can maximize the linear variation of the data. PCA allows the amount of information lost to also be observed and for adjustments in the new vectors chosen to be made. Another example technique is t-Stochastic Neighbor Embedding (t-SNE).

Ensemble methods can be used, which primarily use the idea of combining several predictive models, which can be supervised ML or unsupervised ML to get higher quality predictions than each of the models could provide on their own. As one example, random forest algorithms Neural networks and deep learning techniques can also be used for the techniques described above. Neural networks generally attempt to replicate the behavior of biological brains in turning connections between an input and output "on" or "off" in an attempt to maximize a chosen objective.

While this disclosure contains many specific implementation details, these should not be construed as limitations on the scope of what may be claimed, but rather as descriptions of features specific to particular implementations. Certain features that are described in this specification in the context of separate implementations may also be implemented in combination in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Aspects of the disclosed technology include any combination of the following features or aspects:

Aspect 1. A method for predicting link design margins, the method comprising:
  obtaining a plurality of link features associated with an optical link;
  simulating the optical link with a first model based on the plurality of link features to produce a first value;
  obtaining empirically one or more performance metrics associated with the optical link;
  calculating a second value based on the one or more performance metrics;
  determining one or more prediction error values based on the first value and the second value;
  training or updating a machine learning model using the plurality of link features and at least one of the one or more prediction error values or the one or more performance metrics.

Aspect 2. The method of Aspect 1 further comprising providing a predicted link capacity margin for a new optical link based on one or more prediction error values.

Aspect 3. The method of Aspects 1 or 2 further comprises determining variability of each of the one or more prediction error values for each of the plurality of link features.

Aspect 4. The method of any of the preceding Aspects wherein the one or more performance metric comprises a generalized signal to noise ratio.

Aspect 5. A method for predicting link capacity margins, the method comprising:
  simulating the optical link with a first model based on a plurality of link features to produce a first simulated value;
  providing to a trained machine learning model the plurality of link features and the first simulated value; and
  outputting by the trained machine learning model an error range associated with the first simulated value.

Aspect 6. The method of Aspect 5 further comprising determining a margin based on the output of the trained machine learning model.

Aspect 7. The method of Aspects 5 or 6 wherein the error range is based on trained variability values.

Aspect 8. The method of Aspect 7 further comprising determining a margin for the optical link based on the predicted error range.

Aspect 9. The method Aspects 5-8 further comprising providing as an output a relationship between generalized signal to noise ratio and frequency for at least one set of link features.

Aspect 10. The method of Aspect wherein the set of link features is one of a multiplexer, amplifier, or optical fiber.

Aspect 11. A non-transient computer readable medium containing program instructions, the instructions when executed perform the steps of:
  simulating the optical link with a first model based on a plurality of link features to produce a first simulated value;
  providing to a trained machine learning model the plurality of link features and the first simulated value; and
  outputting by the trained machine learning model an error range associated with the first simulated value.

Aspect 12. The non-transient computer readable medium of Aspect 11 further comprising determining a margin based on the output of the trained machine learning model.

Aspect 13. The non-transient computer readable medium of Aspects 11 or 12 wherein the error range is based on trained variability values Aspect 14. The non-transient computer readable medium of Aspects 11-13 further comprising providing as an output a relationship between generalized signal to noise ratio and frequency for at least one set of link features Aspect 15. The non-transient computer readable medium of Aspects 11-14 further comprising providing as an output a relationship between generalized signal to noise ratio and frequency for at least one set of link features.

Aspect 16. The non-transient computer readable medium of Aspects 11-15 wherein the set of link features contains at least one of a multiplexer, amplifier, or optical fiber.

Aspect 17. The non-transient computer readable medium of Aspects 11-15 wherein the trained machine learning model is trained on a sets of data, each set of data associated with an optical network, each set of data comprising (i) a simulated value for the optical network, (ii) a set of link features, and (iii) empirical data from the optical network.

The invention claimed is:

1. A method for predicting link design margins, the method comprising:
  using one or more processors configured to control the steps of receiving a plurality of link features in the form of a plurality of values corresponding to respective variables, each value being from a known range or set of values associated with the corresponding variable, the link features being associated with a physical optical link and forming a signature for the physical optical link;
  simulating the physical optical link with a first model based on the plurality of link features to produce a first value;
  obtaining empirically one or more performance metrics associated with the physical optical link;
  calculating a second value based on the one or more performance metrics;
  determining one or more prediction error values based on the first value and the second value, wherein the one or more prediction error values are indicative of the accuracy of the simulation of the first value; and
  training or updating a machine learning model using the plurality of link features and at least one of the one or more prediction error values or the one or more performance metrics, wherein the training or updating comprises training or updating the machine learning model to output corrections for application to outputs of the first model.

2. The method of claim 1 further comprising providing a predicted link capacity margin for a new physical optical link based on one or more prediction error values.

3. The method of claim 1 further comprises determining variability of each of the one or more prediction error values for each of the plurality of link features.

4. The method of claim 1 wherein the one or more performance metric comprises a generalized signal to noise ratio.

5. A method for predicting link capacity margins, the method comprising:
using one or more processors configured to control the steps of
receiving a plurality of link features in the form of a plurality of values corresponding to respective variables, each value being from a known range or set of values associated with the corresponding variable, the link features being associated with a physical optical link and forming a signature for the physical optical link;
simulating the physical optical link with a first model based on the plurality of link features to produce a first simulated value;
providing to a trained machine learning model the plurality of link features and the first simulated value; and
outputting by the trained machine learning model corrections for application to outputs of the first model and an error range associated with the first simulated value, wherein the error range is indicative of the accuracy of the simulation of the first value.

6. The method of claim 5 further comprising determining a margin based on the output of the trained machine learning model.

7. The method of claim 5 wherein the error range is based on trained variability values.

8. The method of claim 7 further comprising determining a margin for the physical optical link based on the predicted error range.

9. The method claim 5 further comprising providing as an output a relationship between generalized signal to noise ratio and frequency for at least one set of link features.

10. The method of claim 5 wherein the set of link features is one of a multiplexer, amplifier, or optical fiber.

11. A non-transient computer readable medium containing program instructions, the instructions when executed cause one or more processors to control the steps of:
receiving a plurality of link features in the form of a plurality of values corresponding to respective variables, each value being from a known range or set of values associated with the corresponding variable, the link features being associated with a physical optical link and forming a signature for the physical optical link;
simulating the physical optical link with a first model based on the plurality of link features to produce a first simulated value;
providing to a trained machine learning model the plurality of link features and the first simulated value; and
outputting by the trained machine learning model corrections for application to outputs of the first model and an error range associated with the first simulated value, wherein the error range is indicative of the accuracy of the simulation of the first value.

12. The non-transient computer readable medium of claim 11 further comprising determining a margin based on the output of the trained machine learning model.

13. The non-transient computer readable medium of claim 12 wherein the error range is based on trained variability values.

14. The non-transient computer readable medium of claim 11 further comprising providing as an output a relationship between generalized signal to noise ratio and frequency for at least one set of link features.

15. The non-transient computer readable medium of claim 11 further comprising providing as an output a relationship between generalized signal to noise ratio and frequency for at least one set of link features.

16. The non-transient computer readable medium of claim 11 wherein the set of link features contains at least one of a multiplexer, amplifier, or optical fiber.

17. The non-transient computer readable medium of claim 11 wherein the trained machine learning model is trained on a sets of data, each set of data associated with a physical optical network, each set of data comprising (i) a simulated value for the physical optical network, (ii) a set of link features, and (iii) empirical data from the physical optical network.

* * * * *